United States Patent

Wang et al.

[11] Patent Number: 5,905,656
[45] Date of Patent: May 18, 1999

[54] METHOD AND APPARATUS FOR DISPENSING A LIQUID

[75] Inventors: Wen Y. Wang, Tao-Yaun; Yu L. Ma, Hsin-Chu; Shih S. Jang, Hsin-Chu; Tun L. Lee, Hsin-Chu, all of Taiwan

[73] Assignee: Taiwan Semiconductor Manufacturing Co., Ltd., Hsin-Chut, Taiwan

[21] Appl. No.: 08/844,204

[22] Filed: Apr. 18, 1997

[51] Int. Cl.⁶ ............................... B05B 3/00; B05B 12/08
[52] U.S. Cl. .................... 364/528.18; 364/528.4
[58] Field of Search ................... 222/1, 14, 17, 222/21, 33, 52, 55–59, 77, 639; 141/1, 192, 83; 364/479.01, 479.02, 528.18, 528.17, 528.4; 702/101, 50, 100, 173, 87–89; 118/669, 680–681, 699, 319, 52

[56] References Cited

U.S. PATENT DOCUMENTS

| | | | |
|---|---|---|---|
| 4,670,007 | 6/1987 | Wheeldon et al. | 604/65 |
| 5,007,560 | 4/1991 | Sassak | 222/1 |
| 5,134,962 | 8/1992 | Amada et al. | 222/52 X |
| 5,423,455 | 6/1995 | Ricciardi et al. | 222/1 |
| 5,725,664 | 3/1998 | Nanbu et al. | 118/52 |
| 5,803,970 | 9/1998 | Tateyama et al. | 118/319 |

*Primary Examiner*—Melanie Kemper
*Attorney, Agent, or Firm*—Tung & Associates

[57] ABSTRACT

The present invention discloses a system and method for controlling the dispensing of a fine liquid for coating or other applications, by detecting the volume of liquid dispensed when coating a single workpiece and sending a signal to a controller to disable the dispensing when an insufficient volume of liquid is being dispensed. In a preferred embodiment, the fine liquid is spin-on-glass (SOG) used in semiconductor processing machinery during wafer fabrication and the the SOG volume dispensed when coating a semiconductor wafer is measured using a weight measurement instrument, e.g., an electronic scale capable of 0.1 gm. accuracy, which outputs a weight signal that is input, along with a dispenser condition signal from the SOG dispensing machine, to a programmable logic controller (PLC). A set point is selected to produce a desired weight of dispensed liquid, e.g., 1.7 gms. when 2 ccs. are desired, and is programmed into the PLC. The PLC detects and controls the dispenser and counts the weight reduction recorded by the scale from the beginning of dispensing until reaching the set point. The weight difference is directly related to the volume of SOG dispensed. The scale is reset to 0 after each dispensing period so that the reading is positive. When the set point is reached, the PLC stops counting and the weight difference is checked. If the weight is insufficient, a signal is sent to cause an alarm and interlock to prevent further machine operation until restarted by an operator.

16 Claims, 2 Drawing Sheets

METHOD AND APPARATUS FOR DISPENSING A LIQUID

FIELD OF THE INVENTION

The present invention generally relates to liquid dispensing in processing machinery and the control thereof and, more particularly, to a method and apparatus for detecting the volume of liquid dispensed when coating a workpiece, such as the spin-on-glass (SOG) volume dispensed when coating a semiconductor wafer during fabrication, and sending a signal to a controller to disable the machinery when an incorrect liquid volume is being dispensed as compared to a preselected volume.

BACKGROUND OF THE INVENTION

In processing machinery there are many functions involving the fine dispensing of liquids, such as onto workpieces, where the volume being dispensed must be carefully controlled. However, in many of these applications the apparatus for detecting the volume of liquid being dispensed is inaccurate and inefficient in controlling the correction of the process when the dispensed volume is not a preselected or target volume. This can lead to costly product waste and machine down time. For example, in the fabrication of semiconductor wafers, the wafer surfaces are coated with a glass that is dropped from a dispenser onto the wafer surface at its center while the wafer is being spun so that the glass is spread by centrifugal force evenly across the surface. As the SOG coating (dripping) amount is small, about 2 cc., and its density is about 0.86 gm/cc., its weight is only about 1.6–1.7 gms. This 2 cc. amount can be transported from a bottle or other reservoir and dispensed from a very small Teflon tubing, so that it is very difficult to effectively determine how much liquid has been dispensed and whether there is enough SOG dispensed onto the wafer. Presently, such processing machines use a level sensor, already in the machine as purchased, which senses the capacitance of the dielectric material (i.e., SOG). But, this sensor can only detect the SOG level, and essentially tells whether the SOG is all consumed. It can not be used to detect the volume of each dispensing of SOG, i.e., whether it was 2 cc. or not. Consequently, the machine may be dispensing an insufficient amount of liquid for proper coating over a considerable period resulting in the loss of an inordinate amount of product; or conversely, if the sensor indicates incorrect dispensing when the amount is acceptable, constant unnecessary machine stoppage can be costly.

There is clearly a need in the fine liquid dispensing art of a method and means for more accurately determining the amount of liquid being dispensed during a single application to a surface or workpiece.

It is therefore an object of the present invention to provide an apparatus and method for closely monitoring the amount of fine liquid being dispensed during a coating or similar process.

It is another object of the invention to provide an apparatus and method for accurately determining the volume of fine liquid being dispensed during each application in a process.

It is a further object of the invention to provide a system and method for accurately measuring the volume of fine liquid being dispensed during each application in a process and producing an alarm and machine interlock when the volume becomes insufficient.

SUMMARY OF THE INVENTION

In accordance with the present invention, a system and method are provided for controlling the dispensing of a fine liquid for coating or other applications, and, more particularly, to a method and means for detecting the volume of liquid dispensed when coating a single workpiece and sending a signal to a controller to disable the dispensing when an insufficient volume of liquid is being dispensed. In a preferred embodiment, the fine liquid is spin-on-glass (SOG) used in semiconductor processing machinery during wafer fabrication and the system and method are for detecting the SOG volume dispensed when coating a semiconductor wafer. The invention involves the use of a weight measuring instrument, with an assembly that will preferably fit the original SOG level sensor dimensions so that it can be substituted for it or positioned on top of it, which instrument is used to output a weight signal that is input, along with a dispenser condition signal from the SOG dispensing machine, to a programmable logic controller (PLC). The PLC detects and may control the operation of the dispensing machine nozzle arm. A set point is selected for the timing of the nozzle arm dispensing operation, e.g., 2 min., to produce a desired weight of dispensed liquid, e.g., 1.7 gms. when 2 ccs. are desired, and is programmed into the PLC so that the PLC counts the weight reduction recorded by the weight measuring instrument from the beginning of dispensing until reaching the set point. The weight difference is directly related to the volume of liquid or SOG dispensed. The weight measuring instrument is set to 0 after each dispensing period. An electronic scale capable of 0.1 gm accuracy may be used for the weight measuring instrument so that the reduction in weight of 1.7 gms. (2 ccs.) being dispensed is readily detected. When the set point is reached, the PLC stops counting and the weight difference is checked. If the weight is insufficient, a signal is sent to cause an alarm and interlock to prevent further machine operation until restarted by an operator, after recalibrating the PLC to adjust the set point to increase the weight of SOG dispensed. If the weight difference indicates a desired volume has been dispensed, the PLC and the weight measuring instrument are initialized according to their existing calibrations and dispensing is resumed without interruption. An appropriate set point is selected for the dispensing period, which may be in the order of seconds or minutes, to insure that 2 ccs. are dispensed while monitoring the decrease in weight detected by the weight measuring instrument. When the set point is reached, the PLC sends a signal to cause the liquid dispensing nozzle to be moved out of dispensing position and counting then stops. The coating time may similarly be determined, e.g., 1 min. of spinning, to achieve the desired level of coating with 2 cc. of SOG. In the event that the volume of dispensed liquid is too little or too much, the machine is stopped immediately so that the loss of wafers or other product is minimized.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention provides an apparatus and method for closely monitoring the amount of fine liquid being dispensed during a coating or similar process and particularly during each application in the process and producing an alarm and machine interlock when the volume becomes insufficient. The invention embodies a weight measuring instrument which is used to output a weight signal that is input, along with a dispenser condition signal from the fine liquid dispensing machine, to a programmable logic controller (PLC). The PLC detects and may control the operation of the dispensing machine nozzle arm. A set point is selected to produce a desired weight of dispensed liquid and is programmed into the PLC so that the PLC counts the weight reduction recorded by the weight measuring instrument from the beginning of dispensing until reaching the set point, during each application of the liquid. The weight difference is directly related to the volume of liquid dispensed and the weight measuring instrument is set to 0 after each dispensing period. When the set point is reached, the PLC stops counting and the weight difference is checked. If the weight is insufficient, a signal is sent to cause an alarm and interlock to prevent further machine operation until restarted by an operator. The operator can reset the calibration to adjust the set point value to cause the dispensing of more SOG and then initialize the PLC and weight measuring instrument for further operation. If the weight difference indicates a desired volume has been dispensed, the PLC and the weight measuring instrument are initialized according to their existing calibrations and dispensing is resumed without interruption.

Figure 1:
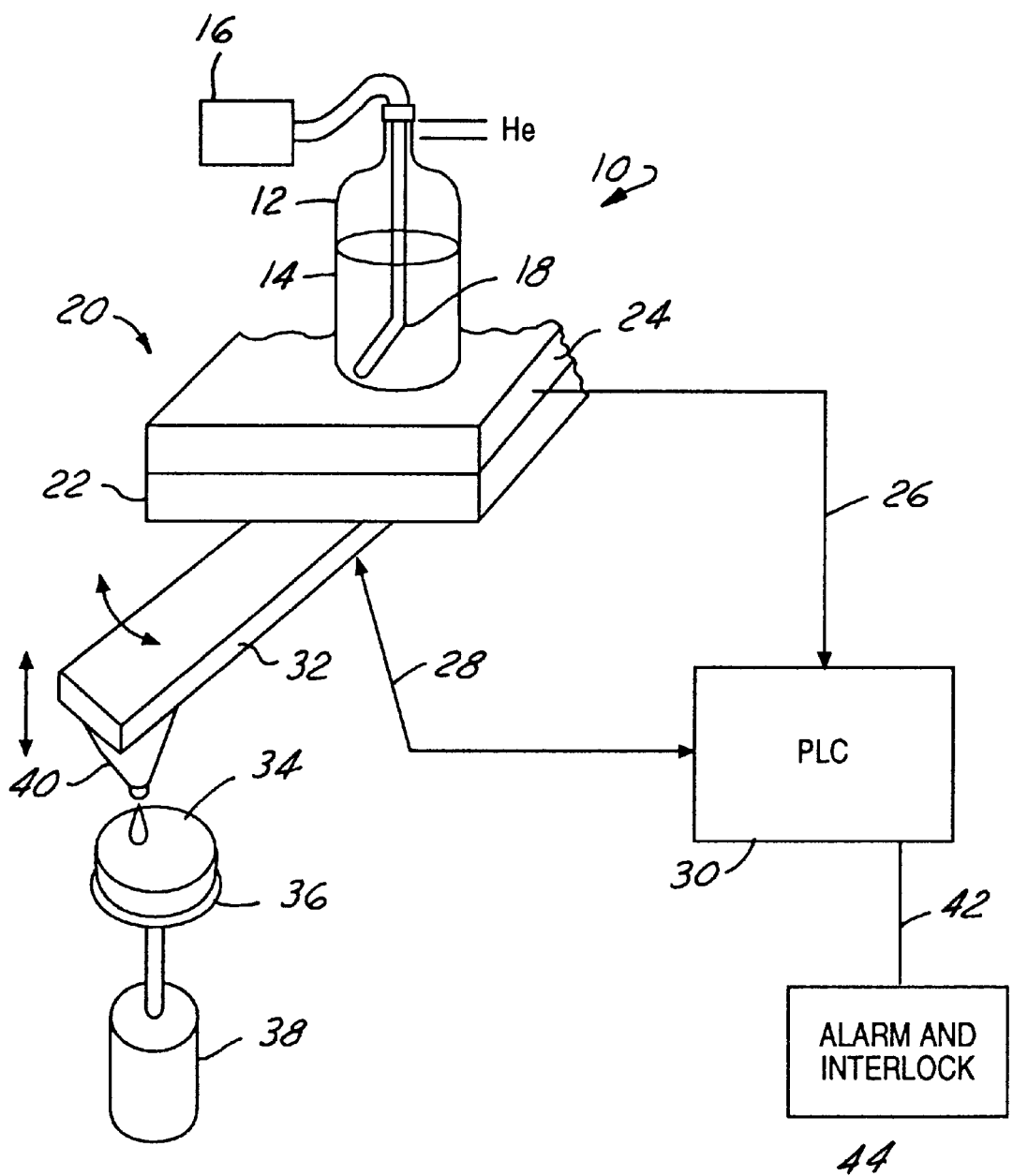
FIG. 1 is a diagrammatic illustration of a fine liquid dispensing machine in accordance with the present invention wherein the fine liquid is spin-on-glass (SOG) being used in semiconductor wafer processing machinery during wafer fabrication for coating the surface of a wafer.

Referring initially to FIG. 1, which shows a fine liquid dispensing machine in accordance with the present invention in the form of a preferred embodiment wherein the fine liquid is spin-on-glass (SOG) being used in a semiconductor wafer processing machine during wafer fabrication for coating the surface of the wafer, it will be seen that a dispenser apparatus 10 is provided with a bottle or container 12 for holding a supply of SOG 14. The SOG may be drawn from a reservoir 16 through a thin Teflon tube 18 and put under pressure in the container 12 by the infusion of a pressurized inert gas, such as helium, therein. The container 12 is disposed on a support device 20 which contains measuring apparatus for detecting the amount of SOG being dispensed from the container 12. One of the measuring devices may be a prior art SOG level sensor 22 which may be optionally be used as an added means for detecting when the dispensing apparatus is out of SOG. The other measuring device is a weight measuring instrument 24 in accordance with the present invention.

The weight measuring instrument 24 is preferably an electronic scale capable of 0.1 gm. accuracy and has an assembly that will preferably fit the original dimensions of the SOG level sensor 22 so that it can be readily substituted for it, or positioned on top of it as shown in FIG. 1. Instrument 24 is used to output a weight signal that is input on line 26, along with a dispenser condition signal from the SOG dispensing machine on line 28, to a programmable logic controller (PLC) 30. The PLC 30 detects and may control the operation of the dispensing machine nozzle arm 32 which may be swung into and out of the dispensing position over a wafer 34 held in a chuck 36 and rotated or spun by a motor 38. The nozzle 40 may also be moved up and down for dispensing the fine liquid or SOG with a clearance of about 5 mm. onto the center of the surface of the wafer 34. For example, the dispensing time may be about 2 mins. and the coating time about 1 min. when 2 ccs. of SOG are being dispensed onto a conventional wafer.

In operating the weight measuring instrument 24 and PLC 30 combination of the invention, a set point is selected to produce a desired weight of dispensed liquid, e.g., 1.7 gms. when 2ccs. are desired. This selected set point is programmed into the PLC 30 so that the PLC counts the weight reduction recorded by the weight measuring instrument 24 from the beginning of dispensing until reaching the set point whereupon dispensing is ceased. The set point may be used to control the dispensing from the nozzle 40 such that the nozzle arm 32 is moved out of dispensing position when the set point is reached. The weight difference measured during dispensing is directly related to the volume of liquid or SOG dispensed. The weight measuring instrument 24 is set to 0 after each dispensing period. As the electronic scale used for the measuring instrument 24 is capable of 0.1 gm accuracy, a reduction in weight of 1.7 gms. (2 ccs.) is readily detected. When the set point is reached, the PLC 30 stops counting and the weight difference is checked. If the weight is insufficient for the desired volume, a signal is sent on line 42 to cause an alarm and interlock device 44 to prevent further machine operation until it is restarted by an operator. The operator may reset the calibration by adjusting the set point to increase the volume of SOG dispensed. The PLC 30 and weight measuring instrument 24 may then be initialized with the new calibration and the dispensing operation resumed. If the weight difference indicates a desired volume has been dispensed, the PLC 30 and the weight measuring instrument 24 are initialized according to their existing calibrations and dispensing is resumed without interruption. As noted, the dispensing period may be about 2 mins., and an appropriate set point is selected to insure that 2 ccs. are dispensed while monitoring the decrease in weight detected by the weight measuring instrument 24. When the set point is reached, the PLC 30 also sends a signal over line 28 to the dispensing mechanism to cause the liquid dispensing nozzle 40 to be moved out of dispensing position and PLC counting then stops. The coating time may similarly be determined, e.g., 1 min. of spinning, to achieve the desired level of coating with 2 cc. of SOG.

Figure 2:
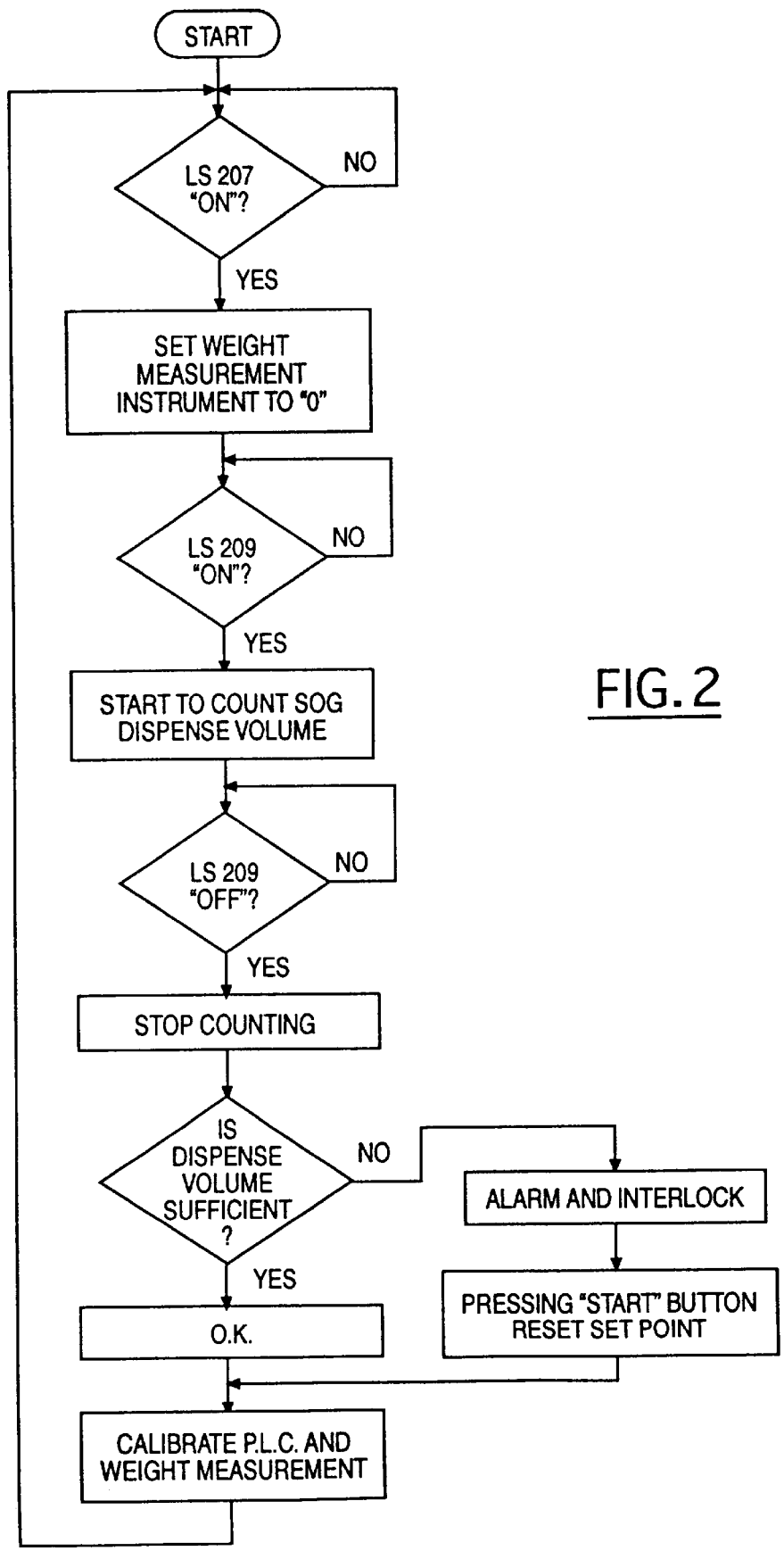
FIG. 2 is a flowchart illustrating the operating steps of the fine liquid dispensing machine of FIG. 1.

FIG. 2 is a flowchart diagrammatically illustrating the foregoing operating steps of the fine liquid dispensing machine of the invention. When the dispensing apparatus is started, a signal is sent to initialize the PLC 30 and the weight measuring instrument 24. Then a check is made for a process machine ON signal (LS 207) that indicates that the nozzle arm 32 is up, that is raised and ready to dispense. If it is not, a NO signal is sent to reorient the machine and try again. When a YES is obtained, a counter of the weight measuring instrument 24 is set to 0 and a check is made for another process machine ON signal (LS 209) that indicates that the nozzle arm 32 is down, that is, is in a swung out position above the wafer surface. If it is not, a NO signal is sent to reorient the machine and try again until a YES is produced. The YES signal starts the counter, which counts while the SOG is being dispensed to monitor the dispensed volume. That volume is directly related to the reduction in weight of the bottle 12 as determined by the weight measuring instrument 24. While the SOG is being dispensed, checks may be made to determine whether the process machine OFF signal has occurred or the ON signal is still operative, i.e., whether the set point has been reached. If the ON signal is detected, the check operation is recycled by a NO signal. When the OFF signal is detected, a YES signal stops the counter which then contains the dispensed volume indication. A check is then made to determine if the dispensed volume was sufficient. If not, a NO signal is sent to activate the alarm and interlock 44 ceasing further operation of the dispenser apparatus 10. An operator must then check the calibration and adjust the set point to increase the volume of SOG dispensed. The pressing of a START button or other actuator may then initialize and reset the PLC 30 to resume the dispensing operation with the adjusted calibration. On the other hand, if the dispensed volume is found to be sufficient, a YES signal is emitted to turn on an indicator light or other indicator that the dispensing function is proceeding properly, i.e., is OK and the PLC 30 and the weight measuring instrument 24 are initialized and send a START signal to begin dispensing the next 2 ccs. of SOG onto the surface of a subsequent wafer. Conversely, of course, if the volume of SOG is found to be excessive, the set point can be adjusted to reduce the amount of SOG dispensed. The initialization process resets the calibrated values, such as nozzle movement parameters and the set point in the PLC, for the dispensing components and also zeros the counter to resume monitoring of the dispensed volume. The dispensing process will normally continue, unless sooner stopped, until the SOG weight drops below 2 ccs. or a signal is sent by a waste tank full sensor to the PLC 30 activating a shutoff relay.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the invention. For example, the system may be used for photoresist dispensing.

The embodiment of the invention in which an exclusive property or privilege is claimed are defined in the following claims:

What is claimed is:

1. Apparatus for controlling the dispensing of a fine liquid used to coat a semiconductor wafer during fabrication thereof, comprising:

container means for holding a supply of fine liquid to be dispensed;

means for dispensing said fine liquid from said container means onto said wafer, said dispensing means having a dispensing nozzle which is movable between a dispensing position over said wafer and a non-dispensing position spaced away from said wafer;

means for detecting the position of said dispensing nozzle and producing a position signal indicative thereof;

means for measuring the weight of said dispensing container before and after the dispensing of a portion of said supply of fine liquid therefrom and producing a weight signal indicative thereof; and controller means, responsive to said position signal and said weight signal, for determining the amount of said portion of fine liquid dispensed, for comparing said dispensed amount with a preselected amount of fine liquid to be dispensed, for producing a signal indicating a difference in said compared amounts, and for controlling the movement of said dispensing nozzle in accordance with the results of the comparison of the dispensed amount with the preselected amount.

2. Apparatus according to claim 1 wherein said controller means comprises a programmable logic controller (PLC).

3. Apparatus according to claim 1 wherein said controller means comprises:

means, responsive to said position signal, for counting during the dispensing of said portion of said supply of fine liquid to produce said weight signal; and means, responsive to said weight signal, for measuring the amount of said portion of said supply of fine liquid.

4. Apparatus according to claim 3 wherein said controller means comprises:

means for resetting said counting means to zero after said weight signal is produced.

5. Apparatus according to claim 1 wherein said controller means comprises:

calibrating means for selecting a set point to determine the timing of the dispensing of said portion of said fine liquid to result in the dispensing of said preselected amount.

6. Apparatus according to claim 5 wherein said controller means comprises:

recalibrating means, responsive to said signal indicating a difference in said compared amounts, for selecting a new set point to determine the timing of the dispensing of said portion of said fine liquid to result in the dispensing of said preselected amount.

7. Apparatus according to claim 1 wherein said controller means comprises:

means, responsive to said signal indicating a difference in said compared amounts, for producing a signal to cease operation of said dispensing means.

8. Apparatus according to claim 1 wherein said means for measuring the weight of said dispensing container comprises an electronic scale.

9. Apparatus according to claim 8 wherein said fine liquid is SOG and said electronic scale is capable of 0.1 gm accuracy.

10. A method for controlling the dispensing of a fine liquid used to coat a semiconductor wafer during fabrication thereof, comprising the steps of:

(A) providing a container for holding a supply of fine liquid to be dispensed;

(B) moving a fine liquid dispensing nozzle between a dispensing position over said wafer and a non-dispensing position spaced away from said wafer;

(C) detecting the position of said dispensing nozzle and producing a position signal indicative thereof, (D) measuring the weight of said dispensing container before and after the dispensing of a portion of said supply of fine liquid therefrom and producing a weight signal indicative thereof; and (E) using said position signal and said weight signal for determining the amount of said portion of fine liquid dispensed;

(F) comparing said dispensed amount with a preselected amount of fine liquid to be dispensed and producing a signal indicating a difference in said compared amounts; and (G) controlling the movement of said dispensing nozzle in step (B) in accordance with the results of the comparison performed in step (F).

11. A method according to claim 10 wherein said controller means comprises a programmable logic controller (PLC).

12. A method according to claim 10 further comprising the steps of:

in response to said position signal, counting during the dispensing of said portion of said supply of fine liquid to produce said weight signal; and in response to said weight signal, measuring the amount of said portion of said supply of fine liquid.

13. A method according to claim 12 further comprising the step of:

resetting said counting to zero after said weight signal is produced.

14. A method according to claim 10 further comprising the step of:

selecting a set point to determine the timing of the dispensing of said portion of said fine liquid to result in the dispensing of said preselected amount.

15. A method according to claim 14 further comprising the step of:

in response to said signal indicating a difference in said compared amount, selecting a new set point to determine the timing of the dispensing of said portion of said fine liquid to result in the dispensing of said preselected amount.

16. A method according to claim 10 further comprising the step of:

in response to said signal indicating a difference in said compared amounts, producing a signal to cease the dispensing of said fine liquid.

* * * * *